INTEGRATED CIRCUIT BIASING ARRANGEMENTS

Original Filed Nov 29, 1965

Inventor:
LEOPOLD A. HARWOOD

BY Eugene M. Whitacre

Attorney

United States Patent Office

Re. 27,454
Reissued Aug. 1, 1972

27,454

INTEGRATED CIRCUIT BIASING ARRANGEMENTS

Leopold Albert Harwood, Somerville, N.J., assignor to RCA Corporation

Original No. 3,383,612, dated May 14, 1968, Ser. No. 510,307, Nov. 29, 1965. Application for reissue Dec. 2, 1970, Ser. No. 94,637
Int. Cl. H03f *3/14*
U.S. Cl. 330—22 10 Claims

Matter enclosed in heavy brackets [ ] appears in the original patent but forms no part of this reissue specification; matter printed in italics indicates the additions made by reissue.

ABSTRACT OF THE DISCLOSURE

A low output impedance bias supply for integrated circuit amplifier configurations capable of delivering an output voltage that is a constant fraction of a power supply potential.

This invention relates to electrical circuits, in general, and to biasing arrangements for integrated circuits, in particular.

As used herein, the term integrated circuit refers to a unitary or monolithic semiconductor device or chip which is the equivalent of a network of interconnected active and passive circuit elements. Various problems have presented themselves in the design of such a semiconductor device. One problem, that of cascading resistance-capacitance coupled amplifiers, stems from the fact that an integrated circuit capacitor occupies a considerable area of the semiconductor chip, even for a relatively small amount of capacitance. Since the physical dimensions of the chip are limited, the size of the capacitor, and hence the amount of capacitance available for interstage coupling, must also be limited. Restricting the size of the capacitor, however, limits not only the low frequency response of the amplifier, but the high frequency response as well and, therefore, the gain at the desired signal frequency; and, because of the parasitic shunt capacitance existing across the integrated circuit capacitor structure, the high frequency repsonse of the amplifier will be limited still further. What with the limitations in the processing techniques presently used for fabricating integrated circuit capacitors, in addition, these size restrictions may be a susbtantial source of trouble due to increased shorting between the plates of the capacitor. Consequently, it would be desirable to direct current (D.C.) couple amplifier stages in integrated circuit design wherever possible.

The cascading of D.C. coupled amplifier stages, however, offers probelms of its own. For example, since the D.C. voltage appearing at the output electrode of one stage comprises the input voltage for the next succeeding stage, complicated biasing networks are needed to establish the desired operating points for each of the cascaded stages, D.C. feedback must also be provided for maintaining each operating point stable, and where substantial gain is to be effected in a single integrated circuit device, the phase shifts within the D.C. feedback loop are such as to increase the likelihood of circuit instability. Before D.C. coupled amplifier stages can be cascaded effectively, in addition, both the amplifier stage itself and the manner in which its operating point is established and stabilized must be made substantially insensitive to variations in power supply voltages and environmental temperatures.

Such an amplifier stage has been fully described in the pending application, Ser. No. 396,140, filed Sept. 14, 1964, and entitled, "Signal Translating System." Briefly, that stage includes: (a) a first and a second transistor connected as an emitter coupled amplifier, with the first transistor operating in the base-input, common collector mode and with the second transistor operating in the emitter-input, common base, collector-output mode; (b) a third transistor connected as an emitter follower and directly coupled to receive the signals developed at the collector electrode of the second transistor; and (c) a resistor connected in common to the emitter electrodes of the first and second transistors and substantially one-half the value of a load resistor connected to the colelctor electrode of the second transistor. More will be said about that amplifier stage in the following paragraphs of this specification.

It is an object of the present invention to provide an improved biasing circuit which is suitable for establishing and maintaining a stable operating point for integrated circuit amplifiers in the presence of supply voltage and temperature variations.

A biasing circuit embodying the invention includes a first transistor connected in a degenerated common emitter type configuration and a second transistor connected in a common collector type configuration, with the output electrode of each being coupled to the input electrode of the other.

In accordance with one embodiment of the invention, the output electrode of the first transistor is directly coupled to the input electrode of the second transistor and the output electrode of the second is directly coupled to the input electrode of the first. A resistor connected to the collector electrode of the first transistor is selected to be of substantially the same resistance value as an unbypassed emitter resistor to the first transistor. With the resistors proportioned in this manner, an output voltage is developed across an emitter resistor for the second transistor equal to one-half the value of the power supply voltage for the circuit. The resultant arrangement provides a very low impedance voltage source which may be used to establish and maintain the operating point of a semiconductor amplifier device, such as that described in the Ser. No. 396,140 pending application. A biasing circuit of the type herein described, when incorporated as an integral portion of an integrated circuit including the amplifier to be stabilized, is effective to maintain the operating point of the amplifier substantially constant in the presence of supply voltage variations and temperature changes.

In accordance with another embodiment of the invention, the output electrode of the first transistor is coupled to the input electrode of the second transistor through N additional transistors, which together with the second transistor effectively comprise a "Darlington" type common collector circuit configuration. The resistor connected to the collector electrode of the first transistor is here selected to be (N+1) times the resistance value of the unbypassed emitter resistor for the first transistor. The proportioning of the resistors in this manner provides an output voltage which is equal to $$\frac{1}{N+2}$$

times the power supply voltage over wide variations in supply voltage and temperature. This voltage can also be used to establish and maintain the operating point of an integrated circuit amplifier.

For a better understanding of the present invention, together with further objects thereof, reference is had to the following description, taken in connection with the accompanying drawings, and its scope will be pointed out in the appended claims.

Figure 1:
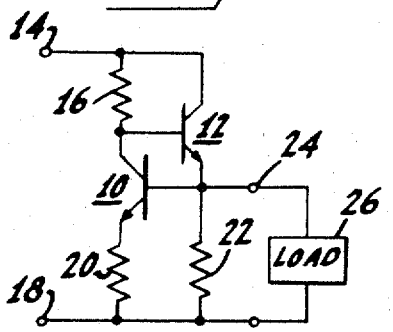
FIGURE 1 is a schematic circuit diagram of a biasing circuit embodying the invention.

Referring now more particularly to FIGURE 1, the biasing circuit there shown includes a pair of transistors 10 and 12. One transistor 10 is arranged in a degenerated common emitter type configuration, with its collector electrode connected to an energizing potential terminal 14 through a first resistor 16 and with its emitter electrode connected to a reference terminal 18 through a second resistor 20. The other transistor 12 is arranged in a common collector type configuration, with its collector electrode directly connected to the energizing potential terminal 14 and with its emitter electrode connected to the reference terminal 18 through a third resistor 22. The emitter electrode of transistor 12 is also connected to the base electrode of transistor 10 and to an output terminal 24 while the collector electrode of transistor 10 is additionally connected to the base electrode of transistor 12. A load circuit 26 is connected between the output terminal 24 and the reference terminal 18. Potential terminal 14 and reference terminal 18 are adapted to be connected to a source of energizing potential of proper polarity (not shown). In the present example, resistor 16 is selected to be of substantially the same resistance value as resistor 20.

If the current drawn by the load 26 is sufficient to permit the proper $V_{be}$ voltage drop to develop across the base-emitter junction of transistor 12, then resistor 22 may be omitted from the biasing circuit of FIGURE 1. As used herein, the term $V_{be}$ voltage represents the average base-to-emitter voltage of a transistor which is operating as the active device in an amplifier circuit or the like. For silicon transistors, this $V_{be}$ voltage is approximately 0.7 volt, which is within the range of the proper $V_{be}$ voltage for Class A amplification. In the discussion that follows, it will be understood that the transistors 10 and 12 are each composed of the same semiconductor material, such as would be the case in monolithic silicon integrated circuits, so that their respective $V_{be}$ voltages are equal.

In operation, i.e. with a proper polarity potential source connected between the terminals 14 and 18, the biasing circuit of FIGURE 1 develops an output voltage between the terminals 24 and 18 which is equal to one-half the value of the applied energizing potential. That this is so can be seen from the following derivation.

At equilibrium, the output voltage ($V_{out}$) developed between the terminals 24 and 18 is equal to the applied energizing potential for the transistor 10 ($V_{in}$) minus the voltage drop across the resistor 16 ($V_{R16}$) and the $V_{be}$ of the transistor 12 or:

$$V_{out}=V_{in}-V_{R16}-V_{be12} \quad (1)$$

The voltage drop across the resistor 20 ($V_{R20}$) at equilibrium is equal to the output voltage ($V_{out}$) developed between the terminals 24 and 18 minus the $V_{be}$ of the transistor 10 or:

$$V_{R20}=V_{out}-V_{be10} \quad (2)$$

Since the resistors 16 and 20 are equal and since the same current flows through each, the voltage drop across the resistor 20 ($V_{R20}$) equals that across the resistor 16 ($V_{R16}$) and the Expression 2 can be substituted for $V_{R16}$ in Equation 1, thusly:

$$V_{out}=V_{in}-V_{out}+V_{be10}-V_{be12} \quad (3)$$

With the $V_{be}$ voltages of transistors 10 and 12 equal when those transistors are composed of the same semiconductor material, as was previously mentioned, the Expression 3 reduces to:

$$V_{out}=\frac{V_{in}}{2} \quad (4)$$

illustrating that the voltage delivered by the biasing circuit to the load 26 equals one-half that of the applied energizing potential for the transistor 10.

Figure 2:
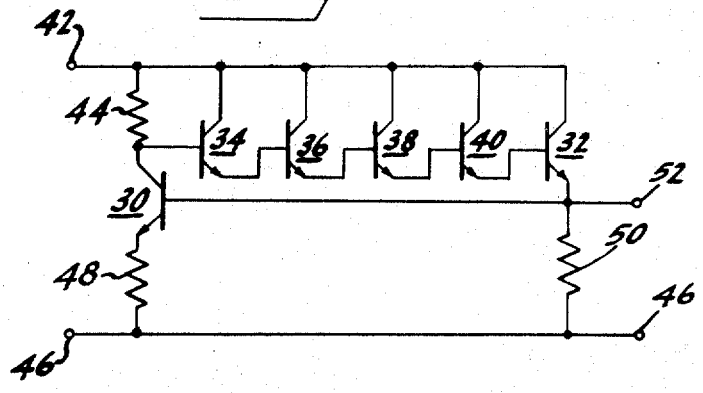
FIGURE 2 is a schematic circuit diagram showing a modification of the biasing circuit of FIGURE 1.

FIGURE 2 shows a modified biasing circuit embodying the present invention. Like the biasing circuit of FIGURE 1, the circuit of FIGURE 2 also includes a first transistor arranged in a degenerated common emitter type configuration and a second transistor arranged in a common collector type configuration. Unlike that circuit, however, the biasing circuit of FIGURE 2 uses transistor coupling to connect the output electrode of the first transistor to the input electrode of the second transistor, rather than the direct coupling used in FIGURE 1.

Referring to FIGURE 2, the biasing circuit there shown includes, for example, six transistors 30, 32, 34, 36, 38 and 40. One transistor 30 is arranged in the degenerated common emitter configuration, with its collector electrode connected to an energizing potential terminal 42 through a first resistor 44 and with its emitter electrode connected to a reference terminal 46 through a second resistor 48. Another transistor 32 is arranged in a common collector configuration, with its collector electrode directly connected to the energizing potential terminal 42 and with its emitter electrode connected to the reference terminal 46 through a third resistor 50. The emitter electrode of transistor 32 is also connected to the base electrode of transistor 30 and to an output terminal 52, to which an appropriate load (not shown) may be connected.

The collector electrode of transistor 30 is additionally connected to the base electrode of transistor 32 through the transistors 34, 36, 38 and 40, which together with the transistor 32 effectively comprise a "Darlington" type common collector configuration. More particularly: the collector electrode of transistor 30 is connected to the base electrode of transistor 34, the emitter electrode of transistor 34 to the base electrode of transistor 36, the emitter electrode of transistor 36 to the base electrode of transistor 38, the emitter electrode of transistor 38 to the base electrode of transistor 40, the emitter electrode of transistor 40 to the base electrode of transistor 32 and the collector electrodes of transistors 34, 36, 38 and 40 to the energizing potential terminal 42. With this mode of transistor coupling, the resistor 44 connected to the collector electrode of transistor 30 is selected to be of five times the resistance value of the resistor 48 connected to the emitter electrode of that transistor.

In operation, i.e. with a proper polarity potential source connected between the terminals 42 and 46, a point of equilibrium is reached at which the output voltage ($V_{out}$) developed between the terminals 52 and 46 is equal to the applied energizing potential for the transistor 30 ($V_{in}$) minus the voltage drop across the resistor 44 ($V_{R44}$) and the $V_{be}$ voltages of the transistors 32, 34, 36, 38 and 40 or:

$$V_{out}=V_{in}-V_{R44}-V_{be32}-V_{34}-V_{be36}-V_{be38}-V_{be40} \quad (5)$$

The voltage drop across the resistor 48 ($V_{R48}$) at equilibrium is equal to the output voltage ($V_{out}$) developed between the terminals 52 and 46 minus the $V_{be}$ of the transistor 30 or:

$$V_{R48}=V_{out}-V_{be30} \quad (6)$$

Since resistor 44 is five times the value of resistor 48 and since the same current flows through each, the voltage drop across the resistor 44 is five times that across the resistor 48 and the Expression 6 can be multiplied by five and substituted for $V_{R44}$ in Equation 5 thusly:

$$V_{out}=V_{in}-5V_{out}+5V_{be30}-V_{be32}-V_{be34}-V_{be36}-V_{be38}-V_{be40} \quad (7)$$

Assuming that the transistors 30, 32, 34, 36, 38 and 40 are each composed of the same semiconductor material, such as would be the case in monolithic silicon integrated circuits, then their respective $V_{be}$ voltages are all equal and the Expresssion 7 reduces to:

$$V_{out}=\frac{V_{in}}{6} \quad (8)$$

Expression 9 thus illustrates that the voltage delivered by the biasing circuit of FIGURE 2 to a load (not shown) connected to its output terminal 52 equals one-sixth that of the applied energizing potential for the transistor 30.

Other integral fractions of the applied energizing potential can be developed as output voltages by changing the transistor coupling between the degenerated common emitter stage and the output common collector stage and by changing the ratio of the resistors in the degenerated common emitter stage accordingly. To be more specific, with N representing the number of stages of transistor coupling between the stages 30 and 32, output voltages equal to $$\frac{1}{N+2}$$

times the applied energizing potential can be developed simply by selecting the collector resistor in the degenerated common emitter stage to be N+1 times the value of the emitter resistor of that stage. A one-third fraction therefore requires one stage of transistor coupling and a 2:1 resistance ratio, a one-fourth fraction requires two stages of transistor coupling and a 3:1 resistance ratio, etc.

Throughout the foregoing derivation, the output voltage of the biasing circuit of FIGURE 2 was considered as being developed between the terminals 52 and 46. If the output voltage is considered as being developed between terminals 52 and 42, instead, analysis will show that the output voltage can be expressed as $$\frac{N+1}{N+2}$$

times the applied energizing potential. Thus, in the arrangement of FIGURE 2, where N equals 4, the voltage developed at output terminal 62 with respect to that at terminal 42 is given by:

$$V_{out}=\frac{5V_{in}}{6} \quad (9)$$

It will be appreciated by one skilled in the art that these general $$\frac{1}{N+2} \text{ and } \frac{N+1}{N+2}$$

expressions for output voltage apply equally as well to the biasing circuit of FIGURE 1, which represents the particular case of N equal to zero.

Figure 3:
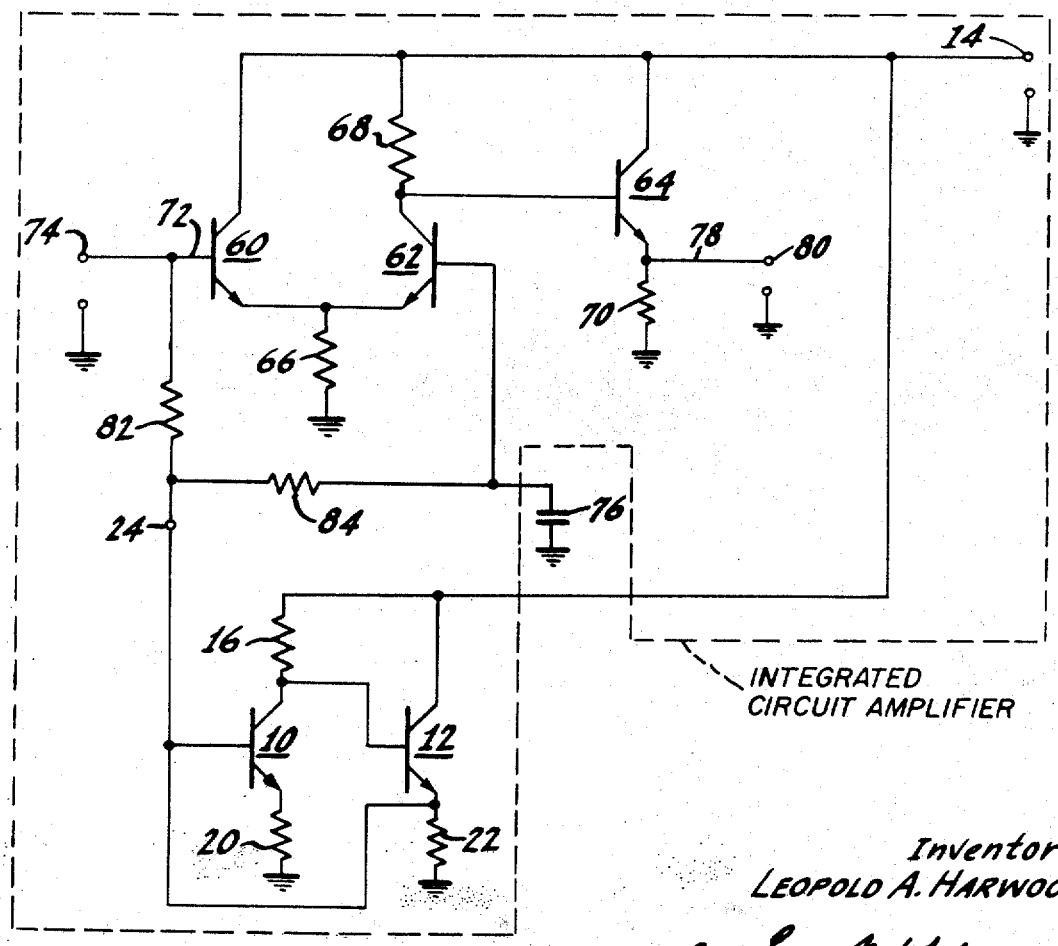
FIGURE 3 is a schematic circuit diagram of an amplifier stage, with bias being provided by a biasing circuit embodying the invention.

FIGURE 3 shows how the biasing circuit of FIGURE 1 is used to establish and maintain the operating point of the semiconductor amplifier circuit described in the Ser. No. 396,140 pending application. In the discussion that follows, it will be understood that both the biasing circuit and the amplifier are formed on a single semiconductor body and comprise at least a portion of an integrated circuit chip. Those numerals used to designate the various components of the biasing circuit in FIGURE 1 are used to identify simliar components in FIGURE 3. Reference terminal 18 has, in addition, been connected to ground.

The amplifier circuit in FIGURE 3 includes three transistors 60, 62 and 64. One transistor 60 is arranged in a common collector type configuration, with its collector electrode directly connected to the energizing potential terminal 14 and with its emitter electrode connected to ground through a resistor 66. A second transistor 62 is arranged in a common base type configuration, with its collector electrode connected to the potential terminal 14 through a resistor 68 and with its emitter electrode connected to ground through the resistor 66. The third transistor 64 is arranged in a common collector type configuration, with its collector electrode directly connected to the terminal 14 and with its emitter electrode connected to ground through a resistor 70. The base electrode of transistor 60 is connected via a conductor 72 to an input terminal 74 while the base electrode of transistor 62 is bypassed to ground at signal frequencies by a capacitor 76. The capacitor 76 is not ordinarily a part of the integrated circuit chip. The collector electrode of transistor 62 also is connected to the base electrode of transistor 64, the emitter electrode of which is connected via a conductor 78 to an output terminal 80 to which an appropriate load (not shown) may be connected. In accordance with the principles of the Ser. No. 396,140 application, resistor 68 is selected to be twice the value of resistor 66 so as to stabilize the amplifier circuit against power supply variations and temperature changes.

The amplifier circuit so described essentially comprises an emitter coupled amplifier stage driving a common collector stage. That is, with a proper polarity potential source connected between terminal 14 and ground, signals supplied to input terminal 74 are amplified first by the combination of transistors 60 and 62 and then by the transistor 64. Amplified signals are developed across the common collector stage resistor 70 and appear thusly at the output terminal 80. Symmetrical amplifier operation is obtained by coupling the output voltage developed at terminal 24 of the biasing circuit to the base electrodes of transistors 60 and 62 through equal value resistors 82 and 84, respectively.

That the biasing circuit of the present invention stabilizes the operating point of the amplifier circuit in the presence of supply voltage variations and temperature changes can be seen from the following discussion. Assume first a variation in the magnitude of the energizing potential applied between terminal 14 and ground. If the bias voltage applied to the base electrodes of the transistors 60 and 62 were maintained constant during the energizing potential variation, the D.C. output voltage at the collector electrode of transistor 62 would change accordingly because the current through transistor 62 would remain constant. Thus, if the voltage at the terminal 14 drops by an amount $\Delta e$ (becomes less positive), then the output voltage at the collector electrode of transistor 62 would drop a like amount. The bias voltage applied to the base electrode of transistor 62 does not remain constant, however, but drops (becomes less positive) by an amount $\Delta e/2$. This follows since, as the expresison (1)–(4) readily show, the voltage delivered by the biasing circuit at its output terminal 24 remains at one-half the value of the applied energizing potential. As a result, the emitter current of transistor 62 falls by $$\left[\frac{\Delta e}{2R_{66}}\right]\frac{\Delta e}{4R_{66}}$$

and its collector voltage rises by $$\left[\frac{\Delta e R_{68}}{2R_{66}}\right]\frac{\Delta e R_{63}}{4R_{66}}$$

The net change in voltage at the collector electrode of transistor 62 is, therefore, $$\left[\Delta e-\frac{\Delta e R_{68}}{4R_{66}}\right]\Delta e-\frac{\Delta e R_{68}}{4R_{66}}$$

which also represents the net change at the emitter electrode of transistor 64. Since resistor 68 is selected to be of twice the resistance value of resistor 66, the net change in voltage at the emitter electrode of the transistor 64 is [zero] $\Delta e/2$. It will be understood that in this paragraph and in the paragraphs to follow $R_{66}$ and $R_{68}$ represent the resistance values of resistors 66 and 68, respectively.

A similar analysis will show that the net change in voltage at the emitter electrode of the transistor 64 will also be [zero] $\Delta e/2$ if the voltage at the terminal 14 increases. In other words, for either case, the change in voltage at the collector electrode of transistor 62 with changing energizing potential will be compensated by a corresponding change in the bias voltage applied to the base electrode of that transistor. Symmetrical amplifier operation continues to be maintained by applying the same bias voltage change to the base electrode of transistor 60.

Consider, next, the effects of temperature change. Temperature change tends to change the $V_{be}$ voltage between the emitter and base electrodes of the transistors 10, 12, 60, 62 and 64. Since these five transistors are composed of the same semiconductor material when incorporated in a monolithic integrated circuit, however, temperature changes affect their $V_{be}$ voltages in equal amounts and in the same direction. As Expressions 3 and 4 readily show, the output voltage developed by the biasing circuit at terminal 24—and, therefore, the bias voltage applied to the base electrodes of transistors 60 and 62—remains substantially constant at one-half the potential applied between terminal 14 and ground and is independent of any temperature change that might occur. Assume then that temperature changes cause a change in the $V_{be}$ of transistors 60 and 62 by an amount $\Delta V_{be}$ and, as a result, a change in the current of those transistors by an amount $\Delta i$.

Then $$\Delta V_{be}=2\Delta i R_{66} \qquad (10)$$

rearranging $$\Delta i=\frac{\Delta V_{be}}{2R_{66}} \qquad (11)$$

The change in the collector voltage of transistor 62 is, therefore:

$$\Delta V_c=\Delta i R_{68} \qquad (12)$$

Substituting (11) into (12):

$$\Delta V_c=\frac{\Delta V_{be} R_{68}}{2R_{66}} \qquad (13)$$

The change in voltage at the emitter electrode of transistor 64 is $\Delta V_c-\Delta V_{be}$ or:

$$\frac{\Delta V_{be} R_{68}}{2R_{66}}-\Delta V_{be}=\Delta V_{be}\left(\frac{R_{68}}{2R_{66}}-1\right) \qquad (14)$$

Since $R_{68}=2R_{66}$, the net change in voltage [as] *at* the emitter electrode of transistor 64 is zero. Analysis of this derivation will show that the net change is zero for both temperature increases and temperature decreases.

An important fact to be noted is that the accuracy with which the output voltage of the biasing circuits of FIGURES 1, 2 and 3 approximates $$\frac{1}{N+2}$$

times the power supply voltage, on the one hand, and $$\frac{N+1}{N+2}$$

times that supply voltage, on the other hand—and, as a result, the stability and balance of bias controlled circuits—is primarily dependent upon the ratio of the collector and emitter resistors for the degenerated common emitter transistor rather than upon their absolute values. This is of special significance in integrated circuit fabrication since the two resistors can be formed at the same time and their ratios can be readily maintained whereas the absolute resistance values are a function of the variables in the fabrication process. Accordingly, with a given process procedure, a higher yield of usable circuits can be expected where the ratios of the circuit components are more significant than the absolute values.

It should be noted that a conventional resistive type voltage divider cannot be substituted for the biasing circuit of this invention and yet give the performance characteristics described above. Considering the arrangement of FIG. 1 as being illustrative, the output impedance of the biasing circuit there shown is given by the expression:

$$Z_{out}=\frac{1}{2g_m}$$

where $g_m$ represents the transconductance of the transistor 12. This impedance is of the order of 20 ohms, and to employ a resistive divider of such a low output impedance would result in a totally unacceptable current being drawn from the type of power supply normally intended for integrated circuit use.

The specific application of the output voltage from a biasing network embodying the invention may differ somewhat from that shown in FIGURE 3 without departing from the scope of the invention. Another circuit for using the controlled bias voltage from a biasing circuit embodying the present invention is shown in the copending application entitled, "Signal Translating System," Ser. No. 510,212, filed concurrently with this application.

What is claimed is:

1. An electrical circuit for providing control voltages comprising:

a plurality of transistors N+2, each having an emitter electrode, a base electrode and a collector electrode, and wherein N represents a positive integer of zero or more;

circuit means coupled to the emitter, base and collector electrodes of a first transistor of said N+2 plurality for connecting said first transistor in a degenerated common emitter configuration, said means including a first resistor connected to the collector electrode of said transistor and substantially N+1 times the resistance value of a second resistor connected to the emitter electrode of said transistor;

circuit means coupled to the emitter, base and collector electrodes of a second transistor of said N+2 plurality for connecting said second transistor in a common collector configuration;

means including N transistors of said N+2 plurality for coupling the collector electrode of said first transistor to the base electrode of said second transistor;

means for coupling the emitter electrode of said second transistor to the base electrode of said first transistor;

a source of energizing potential for the first of said N+2 plurality of transistors;

and means coupled to said second transistor of said plurality for deriving an output voltage therefrom.

2. An electrical circuit as defined in claim 1 in which said last mentioned means is coupled between the emitter electrode of said second transistor and the end of said second resistor remote from the emitter electrode of said first transistor for deriving an output voltage equal to $$\frac{1}{N+2}$$

times the voltage of said energizing potential source.

3. An electrical circuit as defined in claim 1 in which said last mentioned means is coupled between the emitter electrode of said second transistor and the end of said first resistor remote from the collector electrode of said first transistor for deriving an output voltage equal to $$\frac{N+1}{N+2}$$

times the voltage of said energizing potential source.

4. An electrical circuit for providing control voltages comprising:

first and second transistors, each having an emitter electrode, a base electrode and a collector electrode;

first and second terminals adapted to be connected to a source of energizing potential;

a first resistor connected between the collector electrode of said first transistor and said first terminal;

a second resistor connected between the emitter electrode of said first transistor and said second terminal, and being substantially of the same resistance value as said first resistor;

a direct current connection from the collector electrode of said second transistor to said first terminal;

a third resistor connected between the emitter electrode of said second transistor and said second terminal;

a direct current connection from the collector electrode of said first transistor to the base electrode of said second transistor;

a direct current connection from the emitter electrode of said second transistor to the base electrode of said first transistor;

and means for deriving an output voltage between the emitter electrode of said second transistor and one of said first and second terminals.

5. An electrical circuit for providing control voltages comprising:

first and second transistor, each having an emitter electrode, a base electrode and a collector electrode;

first and second terminals adapted to be connected to a source of energizing potential;

a plurality of transistors N connected in series between the collector electrode of said first transistor and the base electrode of said second transistor, each transistor of said N plurality having an emitter electrode, a base electrode and a collector electrode;

a direct current connection from the collector electrode of each transistor of said N plurality to said first terminal;

a direct current connection from the collector electrode of said first transistor to the base electrode of a first transistor of said N plurality;

a direct current connection from the base electrode of said second transistor to the emitter electrode of the last transistor of said N plurality;

a direct current connection from the emitter electrode of each transistor of said N plurality to the base electrode of the next succeeding transistor of said plurality within said serial connection;

a first resistor connected between the collector electrode of said first transistor and said first terminal;

a second resistor connected between the emitter electrode of said first transistor and said second terminal and being substantially $$\frac{1}{N+1}$$

times the resistance value of said first resistor;

a direct current connection from the collector electrode of said second transistor to said first terminal;

a third resistor connected between the emitter electrode of said second transistor and said second terminal;

a direct current connection from the emitter electrode of said second transistor to the base electrode of said first transistor;

and means for deriving an output voltage between the emitter electrode of said second transistor and said second terminal equal to $$\frac{1}{N+2}$$

times the voltage of said energizing potential source.

6. An electrical circuit as defined in claim 5 wherein N=4.

7. A biasing circuit for establishing and maintaining the operating point of a semiconductor amplifier comprising:

first and second transistors, each having an emitter electrode, a base electrode and a collector electrode;

first and second terminals adapted to be connected to a source of energizing potential;

a first resistor connected between the collector electrode of said first transistor and said first terminal;

a second resistor connected between the emitter electrode of said first transistor and said second terminal, and being of substantially the same resistance value as said first resistor;

a direct current connection from the collector electrode of said second transistor to said first terminal;

a third resistor connected between the emitter electrode of said second transistor and said second terminal;

a direct current connection from the collector electrode of said first transistor to the base electrode of said second transistor;

a direct current connection from the emitter electrode of said second transistor to the base electrode of said first transistor;

and means for deriving an output voltage at low impedance equal to one-half the voltage of said energizing potential source between the emitter electrode of said second transistor and said second terminal to bias said semiconductor amplifier at said operating point.

8. A biasing circuit as defined in claim 7 wherein the output impedance exhibited at the emitter electrode of said second transistor is given by the expression $$Z_{out}=\frac{1}{2g_m}$$

in which $g_m$ represents the transconductance of said second transistor.

9. A signal translating stage comprising:

first, second, third, fourth and fifth transistors, each having an emitter electrode, a base electrode and a collector electrode;

circuit means coupled to the emitter, base and collector electrodes of said first and second transistors for connecting said transistors in an emitter coupled amplified configuration, said means including a first resistor connected in common with the emitter electrodes of said first and second transistors and a second resistor connected in the collector circuit of said second transistor;

circuit means coupled to the emitter, base and collector electrodes of said third transistor for connecting said transistor in a common collector configuration;

means for supplying input signals to the base electrode of said first transistor;

direct current means for applying signals from said emitter coupled amplifier configuration to said common collector configuration;

circuit means coupled to the emitter, base and collector electrodes of said fourth transistor for connecting said transistor in a degenerated common emitter configuration, said means including a third resistor connected in the collector circuit of said fourth transistor and a fourth resistor of substantially the same resistance value as said third resistor connected in the emitter circuit thereof;

circuit means coupled to the emitter, base and collector electrodes of said fifth transistor for connecting said transistor in a common collector configuration;

direct current means for connecting the collector electrode of said fourth transistor to the base electrode of said fifth transistor;

direct current means for connecting the emitter electrode of said fifth transistor to the base electrode of said fourth transistor;

a source of energizing potential for said first, second, third, fourth and fifth transistors;

means for deriving a voltage equal to one-half the voltage of said energizing potential source at the emitter electrode of said fifth transistor;

and circuit means for applying said derived voltage to the base electrodes of at least one of said first and second transistors to establish and maintain the operating point of said transistors.

10. In an integrated circuit amplified configuration of the type including: (a) an input transistor having a collector electrode directly connected to a first energizing potential terminal, an emitter electrode connected to a second energizing potential terminal by means of a coupling resistor and a base electrode directly connected to a source of input signals to be amplified; (b) an intermediate transistor having a collector electrode connected to said first terminal by means of a load resistor of substantially twice the resistance value of said coupling resistor, an emitter electrode connected to said second terminal by means of said coupling resistor and a base electrode; and (c) an output transistor having a collector electrode directly connected to said first terminal, an emitter electrode connected to said second terminal by means of an output resistor and a base electrode directly connected to the collector electrode of said intermediate transistor, a biasing circuit for establishing and maintaining the operating point of said amplifier configuration comprising:

first and second transistors incorporated as part of said integrated circuit amplifier configuration, each having an emitter electrode, a base electrode and a collector electrode;

a first resistor connected between the collector electrode of said first transistor and said first terminal;

a second resistor connected between the emitter electrode of said first transistor and said second terminal, and being substantially of the same resistance value as said first resistor;

a direct current connection from the collector electrode of said second transistor to said first terminal;

a third resistor connected between the emitter electrode of said second transistor and said second terminal;

a direct current connection from the collector electrode of said first transistor to the base electrode of said second transistor;

a direct current connection from the emitter electrode of said second transistor to the base electrode of said first transistor;

means for deriving an output voltage equal to one-half the voltage of a source of energizing potential coupled across said first and said second terminals, said output voltage being derived at low impedances between the emitter electrode of said second transistor and said second terminal;

and means including fourth and fifth resistors of substantially equal resistance value for coupling said output voltage to the base electrodes of said input and intermediate transistors to bias said amplifier configuration at said operating point.

References Cited

The following references, cited by the Examiner, are of record in the patented file of this patent or the original patent.

UNITED STATES PATENTS

| | | | |
|---|---|---|---|
| 3,089,098 | 5/1963 | Noe | 330—25 X |
| 3,246,233 | 4/1966 | Herz | 323—22 X |

ROY LAKE, Primary Examiner

J. B. MULLINS, Assistant Examiner

U.S. Cl. X.R.

330—25, 28, 38 M